US007869275B2

(12) United States Patent
Grant et al.

(10) Patent No.: US 7,869,275 B2
(45) Date of Patent: Jan. 11, 2011

(54) MEMORY STRUCTURE CAPABLE OF BIT-WISE WRITE OR OVERWRITE

(75) Inventors: Matthew A. Grant, Palo Alto, CA (US);
David J. Kunst, Cupertino, CA (US);
Steven Huynh, Sunnyvale, CA (US)

(73) Assignee: Active-Semi, Inc. (VG)

( * ) Notice: Subject to any disclaimer, the term of this patent is extended or adjusted under 35 U.S.C. 154(b) by 809 days.

(21) Appl. No.: 11/888,441

(22) Filed: Jul. 31, 2007

(65) Prior Publication Data
US 2008/0084743 A1 Apr. 10, 2008

Related U.S. Application Data

(60) Provisional application No. 60/850,359, filed on Oct. 7, 2006.

(51) Int. Cl.
*G11C 11/34* (2006.01)
(52) U.S. Cl. .................... 365/185.08; 326/39; 365/154; 365/189.08; 365/189.2
(58) Field of Classification Search ............ 365/185.08, 365/185.19, 185.22, 154, 189.08, 189.2; 326/39
See application file for complete search history.

(56) References Cited

U.S. PATENT DOCUMENTS

| 4,132,904 A | 1/1979 | Harari ...................... 307/238 |
| 5,311,470 A | 5/1994 | Atsumi et al. .......... 365/189.05 |
| 5,428,568 A | 6/1995 | Kobayashi et al. ......... 365/185 |
| 5,428,571 A | 6/1995 | Atsumi et al. .......... 365/189.05 |
| 5,592,415 A | 1/1997 | Kato et al. ............. 365/185.01 |
| 5,682,345 A | 10/1997 | Roohparvar et al. ... 365/185.04 |
| 6,141,247 A | 10/2000 | Roohparvar et al. ... 365/185.08 |
| 6,252,823 B1 | 6/2001 | McDonald et al. ............. 368/9 |
| 6,362,675 B1 * | 3/2002 | Alwais ....................... 327/218 |
| 6,401,163 B1 * | 6/2002 | Kondo et al. ................ 711/100 |

(Continued)

FOREIGN PATENT DOCUMENTS

JP 08306192 A * 11/1996

OTHER PUBLICATIONS

English Abstract for JP 08306192 A. Nov. 1996.*
International Search Report and Written Opinion of International Searching Authority for PCT/US07/21379 dated Mar. 10, 2008 (13 pages).

(Continued)

*Primary Examiner*—Alexander Sofocleous
(74) *Attorney, Agent, or Firm*—Imperium Patent Works; Darien K. Wallace

(57) ABSTRACT

An integrated circuit includes a plurality of tiles. One tile is a master tile. Other tiles contain writable registers of memory structures. Information for configuring circuitry of the tile is stored in the register in the tile. An individual one of the registers can be written via the master tile. Each memory structure of a register includes a non-volatile floating gate cell (that stores the configuration information) as well as a volatile cell. All transistors have the same gate insulator thickness. Although a programming pulse signal is applied to all memory structures, the state of the non-volatile cell of a memory structure is only changed if the state stored by the associated non-volatile cell differs from the state stored by the volatile cell. Floating gates are automatically refreshed by the programming pulse signal. By storing configuration information in each tile, inefficiencies associated with using blocks of non-volatile memory are avoided.

21 Claims, 10 Drawing Sheets

U.S. PATENT DOCUMENTS

| | | | |
|---|---|---|---|
| 6,507,943 B1 * | 1/2003 | Kelem ........................ | 716/16 |
| 6,639,839 B1 | 10/2003 | Chou et al. ............ | 365/185.25 |
| 7,053,652 B1 | 5/2006 | de Jong ....................... | 326/41 |
| 7,135,886 B2 * | 11/2006 | Schlacter ..................... | 326/38 |
| 7,474,559 B1 * | 1/2009 | Lakkapragada et al. | 365/185.08 |
| 7,581,198 B2 * | 8/2009 | Huynh et al. .................. | 716/1 |
| 2003/0124791 A1 | 7/2003 | Summerfelt et al. ........ | 438/238 |
| 2003/0214321 A1 | 11/2003 | Swami et al. .................. | 326/38 |
| 2006/0080631 A1 | 4/2006 | Koo ........................... | 716/17 |
| 2006/0123376 A1 | 6/2006 | Vogel et al. .................. | 716/11 |

OTHER PUBLICATIONS

Yamauchi et al., "A Versatile Stacked Storage Capacitor on FLOTOX Cell for Megabit NVRAMs", IEEE Trans. on Electron Devices, vol. 39, No. 12, pp. 2791- 2796 (Dec. 1992).

Ohsaki et al., "A Single Poly EEPROM Cell Structure for Use in Standard CMOS Processes", IEEE Journal of Solid-State Circuits, vol. 29, No. 3, pp. 311- 316 (Mar. 1994).

Simon J. Lovett, "The Nonvolatile Cell Hidden in Standard CMOS Logic Technologies", IEEE Trans. on Electron Devices, vol. 48, No. 5, pp. 1017-1018 (May 2001).

* cited by examiner

NONVOLATILE CELL IS READ (TRANSFER MODE, PGM=0)

MEMORY STRUCTURE CAPABLE OF BIT-WISE WRITE OR OVERWRITE

CROSS REFERENCE TO RELATED APPLICATION

This application claims the benefit under 35 U.S.C. §119 of provisional application Ser. No. 60/850,359, entitled "Single-Poly EEPROM Structure For Bit-Wise Write/Overwrite", filed Oct. 7, 2006. The subject matter of provisional application Ser. No. 60/850,359 is incorporated herein by reference in its entirety.

TECHNICAL FIELD

The present invention relates generally to the design and/or configuration of integrated circuits, and more particularly to the design and/or configuration of integrated circuits involving multiple configurable analog circuits and to non-volatile cells for storing configuration information.

BACKGROUND

FIG. 1 (Prior Art) is a diagram of system 1 involving a type of analog integrated circuit 2 and a microcontroller integrated circuit 3. Analog integrated circuit 2 is sometimes called a "Power Management Unit" or "PMU". It is desired to be able to design and fabricate such a PMU for a custom application in a small amount of time. The custom application may, for example, require that PMU 2 include a number of different types of analog circuits. The analog circuits are designed and laid out so that they pack together and are of irregular shapes as illustrated in FIG. 1. Parts of the analog circuits may be shared. One example of such an analog circuit is a voltage regulator. The voltage regulator might be configurable to output a selectable voltage. The voltage regulator might be configurable so that a current limit of the regulator can be changed. The various analog circuits of PMU 2 might be configurable such that if PMU 2 is configured in one fashion, then certain of the analog circuits are coupled to certain of the integrated circuit input/output (I/O) terminals, whereas if PMU 2 is configured in another fashion then the analog circuits are coupled to others of the I/O terminals. Each of the analog circuits of PMU 2 may, for example, be configurable so that it can be enabled or disabled. There are many ways that the various analog circuits of an analog integrated circuit such as PMU 2 may be designed to be configurable.

In the illustrated example of FIG. 1, PMU 2 includes a block 4 of non-volatile memory. The data content of particular memory cells in block 4 control corresponding particular parts of the various analog circuits of PMU 2. Typically, the designer of PMU 2 determines early in the design process the amount of nonvolatile memory that will be required to store the required configuration information. A semiconductor fabrication process is selected that has the capability of making block 4 of non-volatile memory cells. Once the amount of required non-volatile memory is known, the designer selects an adequately large predesigned block of non-volatile memory. The designer designs and lays out the remainder of the PMU integrated circuit but may leave a blank space in the layout where the chosen predesigned block 4 will be placed. At final layout time, the predesigned and characterized block 4 is instantiated into the layout to occupy the blank space. The PMU integrated circuit is then fabricated so that predesigned block 4 of non-volatile memory is part of the overall integrated circuit 2.

In the example illustrated in FIG. 1, microcontroller 3 can write configuration data into block 4 across bus 5 and using bus interface block 6. Microcontroller 3 causes a pulse of a programming voltage (VPP) to be supplied to PMU 2 via circuit 7 and conductor 8. There are multiple ways of providing this programming voltage signal. Block 7 and conductor 8 is just one way.

The configuration data that is written into block 4 controls and configures the various analog circuits of PMU 2. Thereafter, PMU 2 uses the contents of block 4 to configure its various analog circuits in an appropriate manner for the particular application to which integrated circuit 2 is put. Thereafter, if system 1 is powered down and then powered up again, the contents of non-volatile memory block 4 are used to configure PMU 2 without microcontroller 3 having to perform any additional writes to block 4. Microcontroller 3 can, however, update or change the configuration information stored in block 4 if required.

The conventional design process set forth above has several problems. First, non-volatile memory block 4 is of a design that is generally optimized for bulk data storage purposes. The non-volatile memory block may, for example, have small memory storage cells that require associated sense amplifiers. Block 4 typically involves address decoders to access a large array of such small cells. This associated address decoder and sense amplifier circuitry may be appropriate for designs involving a large amount of data storage, but in cases where only a relatively small amount of configuration information is to be stored, having to provide the associated support circuitry may be inefficient.

Not only may using block 4 involve providing an undesirable amount of support circuitry, but using block 4 requires all the cells that store configuration information to be located in one location on the integrated circuit. Running data lines from this one location to the various locations in the various analog circuits to carry needed configuration information is undesirable as compared to providing the nonvolatile memory cells locally in the analog circuits and then only having to provide relatively short conductors to carry configuration information to the various analog circuits to be configured.

Another drawback of using block 4 is that the size of the block must typically be determined early in the integrated circuit design process. The size of block 4 is determined by the number of bits required to configure the various analog circuits. If, for example, it is decided late in the design process that an additional analog circuit should be provided in PMU 2, then the size of block 4 initially selected may not be large enough to store all the configuration information. Accordingly, the design process of using a predesigned block of non-volatile memory to store configuration information is inflexible and can complicate modifying the remainder of the integrated circuit.

Another drawback of using block 4 is that block 4 may be a FLASH memory whose cells must be erased in blocks or pages. If only one configuration information bit is to be changed, it may nevertheless be necessary to block erase an entire block of FLASH cells and then to rewrite the contents of all the FLASH cells in the block just to change the data value of one of the cells. Having to conduct this block erase and rewrite process is undesirably slow and cumbersome.

Another drawback of using block 4 is that the nonvolatile cells of block 4 may suffer from what is sometimes referred to as "program disturb". If a single cell in the array is to be written, then a pulse of a programming voltage (VPP) is typically supplied to all the cells of the array. Every time such a VPP pulse is applied, a small amount of charge is transferred onto each cell in the array. Even if the data content of a cell is not being changed, the result of the cell experiencing this VPP pulse is that the charge stored on the floating gate of the cell is slowly changed. Over many such VPP pulses, the voltages on the floating gates of the cells may change over time. In some situations, the change may be of such a magnitude that data may be lost.

One last drawback of using block 4 is that a special thin tunneling gate insulator is generally required. This thin tunneling gate insulator is not provided in a standard and typical Complementary Metal Oxide Semiconductor (CMOS) semiconductor fabrication process. Fabricating FLASH cells generally involves using a special FLASH process that is more expensive than a standard CMOS process. Even though only a small amount of FLASH memory may be required, if block 4 of predesigned and precharacterized FLASH memory is selected for use in the PMU design, then the more expensive and non-standard semiconductor fabrication process must be used.

SUMMARY

An integrated circuit includes a plurality of rectangular tiles. One tile is a master tile. The other tiles contain writable registers of memory structures. Information for configuring circuitry of the tile is stored in the tile itself in a writable register. An individual tile may, for example, include configurable analog circuitry such as a configurable battery charger circuit. The configurable battery charger circuit may be configured to have a selectable regulated output voltage, to have a selectable output current limit, and to be selectably disabled and enabled.

An individual one of the writable registers in a selectable one of the tiles can be loaded with configuration information via the master tile. Each memory structure of a register includes a non-volatile floating gate cell (that stores the configuration information) as well as a volatile cell. All transistors in the non-volatile cell and in the volatile cell have the same gate insulator thickness. No special thin tunneling gate insulator is required.

Although a programming pulse signal is applied simultaneously to all memory structures in all the writable registers, the state of the non-volatile cell of a memory structure is only changed if the state stored by its corresponding volatile cell differs from the state stored by the non-volatile cell. Floating gates of memory structures not being written to are refreshed by the programming pulse signal if the programmed voltage on the floating gate has decayed from its originally programmed value. The programming and refreshing of a non-volatile cell are accomplished by tunneling charge onto or off of the floating gate in the non-volatile cell.

By storing configuration information in each tile in such memory structures, inefficiencies associated with using centralized blocks of non-volatile memory are avoided. In one embodiment, the tiles have a standardized data bus and control signal interface structure that facilitates placing tiles adjacent one another during layout and design of the integrated circuit. When the tiles are placed adjacent one another, the data bus and control signal conductors of the adjacent tiles line up and interconnect with one another in an appropriate manner so that the master tile in the final integrated circuit will be able to write to a selected register in any selected one of the other tiles using the data bus and control lines. Tiles can be added or extracted from the integrated circuit design relatively late in the integrated circuit design process without having to change an amount of non-volatile memory provided in a centralized location to store configuration information. Each tile that is added or extracted from the design includes the correct amount of configuration non-volatile memory to support configuration of its circuitry.

The modular tile architecture and design technique shortens IC development times, and may allow a user of the architecture and technique to obtain design wins due to the user being able to design and provide a custom integrated circuit that meets specifications set by a prospective customer in a small amount of time as compared to more conventional IC design and layout techniques. Once the design win has occurred and initial integrated circuits are being supplied to the customer using the modular tile architecture, the layout and/or design of the integrated circuit can be refined, optimized, laid out again, and/or moved to a smaller geometry process so that subsequent versions of the integrated circuit do not have the modular tile design but yet are pin-for-pin compatible with the original modular tile integrated circuit. The re-layout integrated circuit can therefore be used in place of the initial modular integrated circuit in high volume production of the customer's system, resulting in still further efficiencies and lower part cost. An additional novel aspect is therefore the re-layout, refinement, optimization and/or porting to a different process of an initial modular tile integrated circuit employing the novel memory structure set forth in this patent document.

Other structures and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
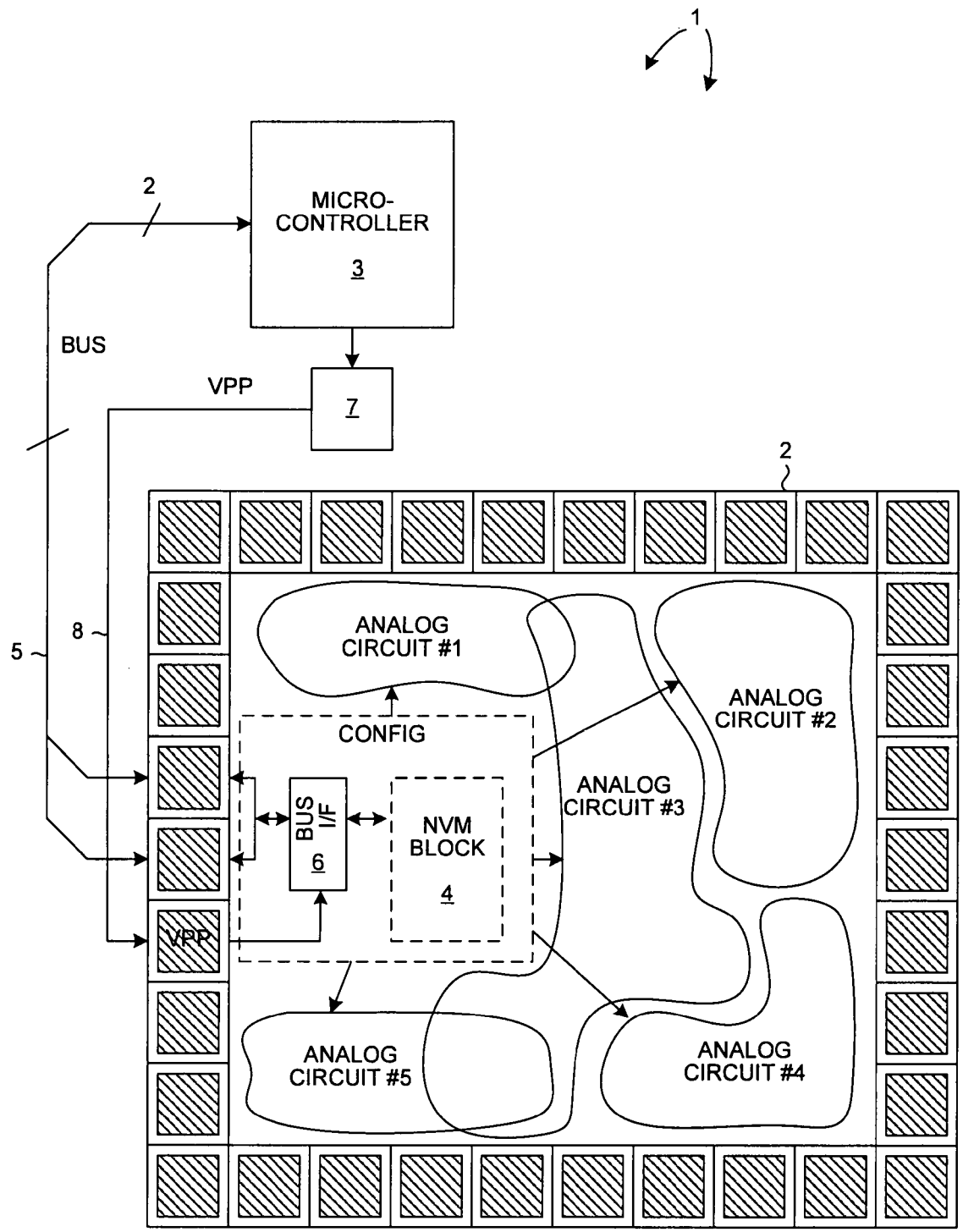
FIG. 1 (prior art) is a diagram of an integrated circuit that is configured by information stored in a block of non-volatile memory.
Figure 2:
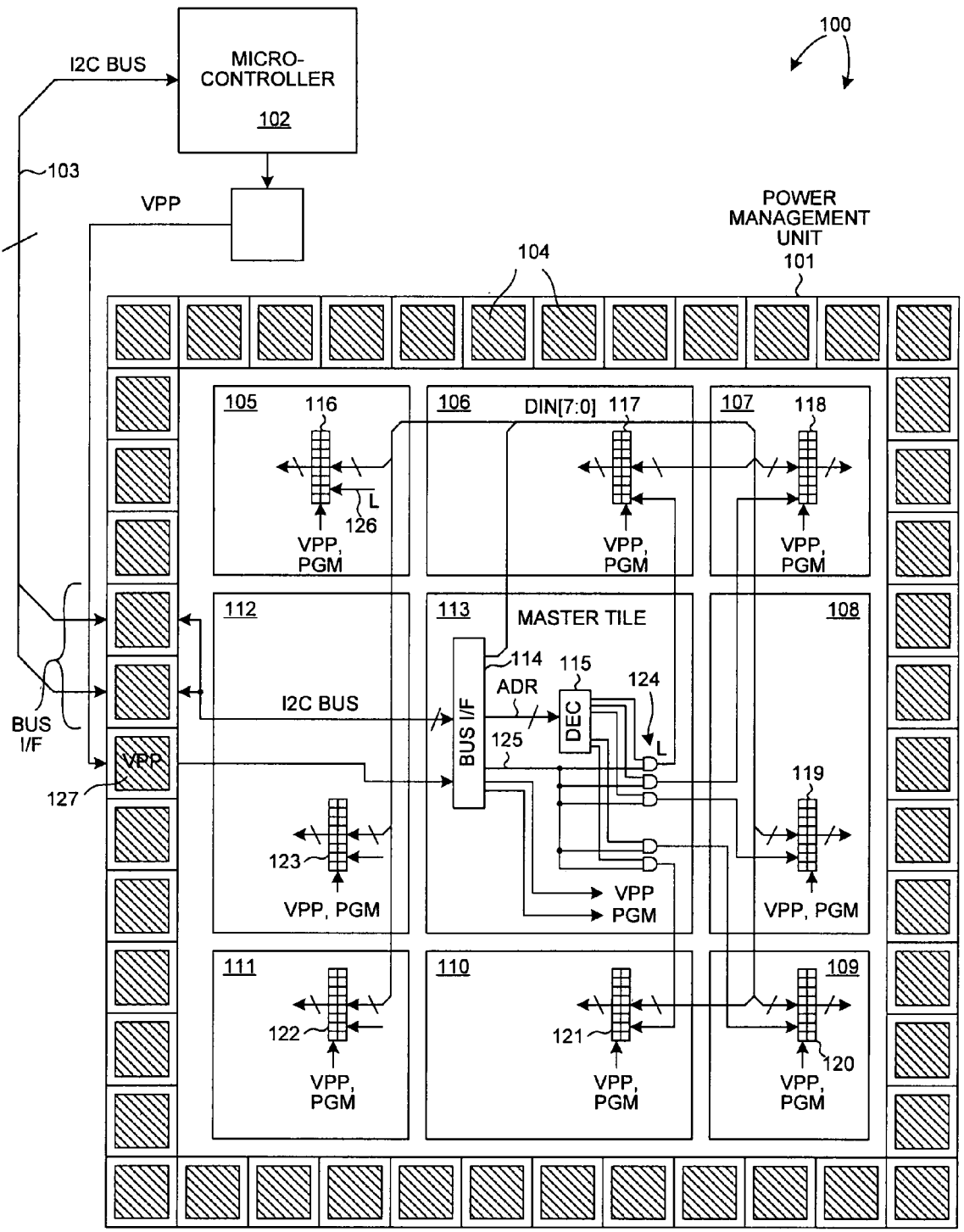
FIG. 2 is a diagram of a system 100 that employs novel memory structures in accordance with one novel aspect.

FIG. 2 is a diagram of a system 100 including a power management unit (PMU) integrated circuit 101, a microcontroller integrated circuit 102, and a bus 103, in accordance with one novel aspect. A PMU is set forth as an example of one type of integrated circuit that can advantageously employ a novel memory structure set forth in this patent document, but it is to be understood that a PMU is just one example. Other types of integrated circuits may also employ the novel memory structure and the novel tile architecture.

PMU integrated circuit 101 includes a ring of input/output (I/O) cells 104, and an inner matrix of rectangular standard-size tiles 105-113. Tile 113 is referred to as the "master tile." Master tile 113 includes a bus interface block 114, a decoder 115, and other logic 124. Each of the other tiles 105-112 includes registers of memory structures. The sides of the standard-size tiles are fixed or have dimensions that are multiples of a predetermined distance (for example, 0.5 millimeters) so that tiles, when placed adjacent on another in the integrated circuit layout, will be disposed on a grid. For additional detail on one suitable modular tile architecture, see: U.S. patent application Ser. No. 11/544,876, filed Oct. 7, 2006 (the entire subject matter of which is incorporated herein by reference).

The memory structures in the standard-size tiles have a novel structure as is set forth in further detail below. In the simplified illustration of FIG. 2, each tile is illustrated to include one eight-bit register of memory structures. These registers are designated with reference numerals 116-123. Bus interface block 114 in master tile 113 is coupled by a common data bus DIN[7:0] to the memory cells in each of the tiles.

In the present example, the tiles embody analog power control circuitry that is to be configured and controlled. An example of such circuitry is a constant current and constant voltage (CC-CV) battery charger circuit in tile 105. This charger circuit is to supply charge current to a battery that is external to integrated circuit 101. The voltage output by the charger circuit is a regulated voltage whose magnitude is determined by a first value stored into various ones of the memory structures of register 116. The current limit of the charger circuit is also programmable and is determined by a second value stored into various other ones of the memory structures of register 116. The charger circuit can also be disabled or enabled. Whether the charger circuit is enabled or disabled is determined by a third value stored into another one of the memory structures of register 116.

Each of the novel memory structures includes a non-volatile cell and a volatile cell. Upon power up of integrated circuit 101, the data content of the non-volatile cell is automatically transferred into the volatile cell. The data stored in the volatile cell in turn is supplied to the circuitry in tile 105 to configure and control the circuitry in tile 105. In one example, upon initial power up of integrated circuit 101, the non-volatile cells of the memory structures of register 116 power up into logic states such that the charger circuit in tile 105 is disabled. Thereafter, microcontroller 102 writes values into the memory structures of register 116 so as to configure the output voltage and the current limit of the charger circuit. Thereafter, microcontroller 102 writes the appropriate value into the appropriate memory structure of register 116 so as to enable the charger circuit. The charger circuit then functions to charge the external battery or external device as desired.

If system 100 were then to be powered down and powered up again, the microcontroller 102 would need not reconfigure the memory structures in tile 105 because the prior configuration information would have been stored in the non-volatile cells of register 116. The data content of the non-volatile cells would be automatically loaded into the volatile cells of register 116 so that it would then configure and control the circuitry of tile 105.

In the illustrated example, each of tiles 105-112 is coupled to receive the same data bus DIN[7:0], the same programming voltage conductor, and the same program signal conductor. The programming voltage conductor and the program signal conductor are designated by arrows labeled VPP and PGM. In addition to each of the tiles receiving these common conductors, each tile is coupled to receive its own local clock signal from master tile 113. The local clock signal supplied to tile 105 is identified by the reference numeral L. Local clock signal L is received by register 116 via clock signal conductor 126. The clock signal for only one of the registers is made to transition at a time. Which particular clock signal is allowed to transition depends on the value of an address ADR that is loaded through the bus interface block 114.

If, for example, microcontroller 102 is to write data into register 116 in tile 105, then microcontroller 102 supplies an address ADR via bus 103 to bus interface block 114. The address ADR is latched into bus interface block 114. Decoder 115 decodes the address. AND gates 124 allow a clock signal to be supplied on only one of the clock output lines. In this example where the address ADR identifies register 116 in tile 105, decoder 115 will allow a clock signal to pass from global clock conductor 125 to the local clock conductor 126 and to register 116.

Microcontroller 102 then writes the data to be written into register 116 into the bus interface block 114 via bus 103. This data is in turn supplied to all the registers of integrated circuit 101 via data bus DIN[7:0]. The bus interface block 114 then asserts the clock signal on global clock conductor 125, thereby supplying a local clock signal to the register that is addressed by address ADR. In the present example, the local clock signal L is supplied to register 116. This local clock signal L clocks the data from data bus DIN[7:0] into the volatile cells of register 116. In this way, microcontroller 102 can write data into the volatile cells of any desired one of the registers 116-123 of integrated circuit 101.

Once data has been written into the volatile cells of the desired register, a programming pulse signal is supplied to integrated circuit 101 via I/O terminal 127. This programming pulse signal is supplied to all the memory structures of all the registers 116-123 of integrated circuit 101. As described further below, each volatile cell in register 116 has a corresponding non-volatile cell. If the data content of the non-volatile cell differs from the data stored in the volatile cell, then the non-volatile cell is programmed to store the same data stored in the volatile cell. If the data content of the non-volatile cell does not differ from the data stored in the volatile cell, then the digital logic state stored in the non-volatile cell is not changed.

Figure 3:
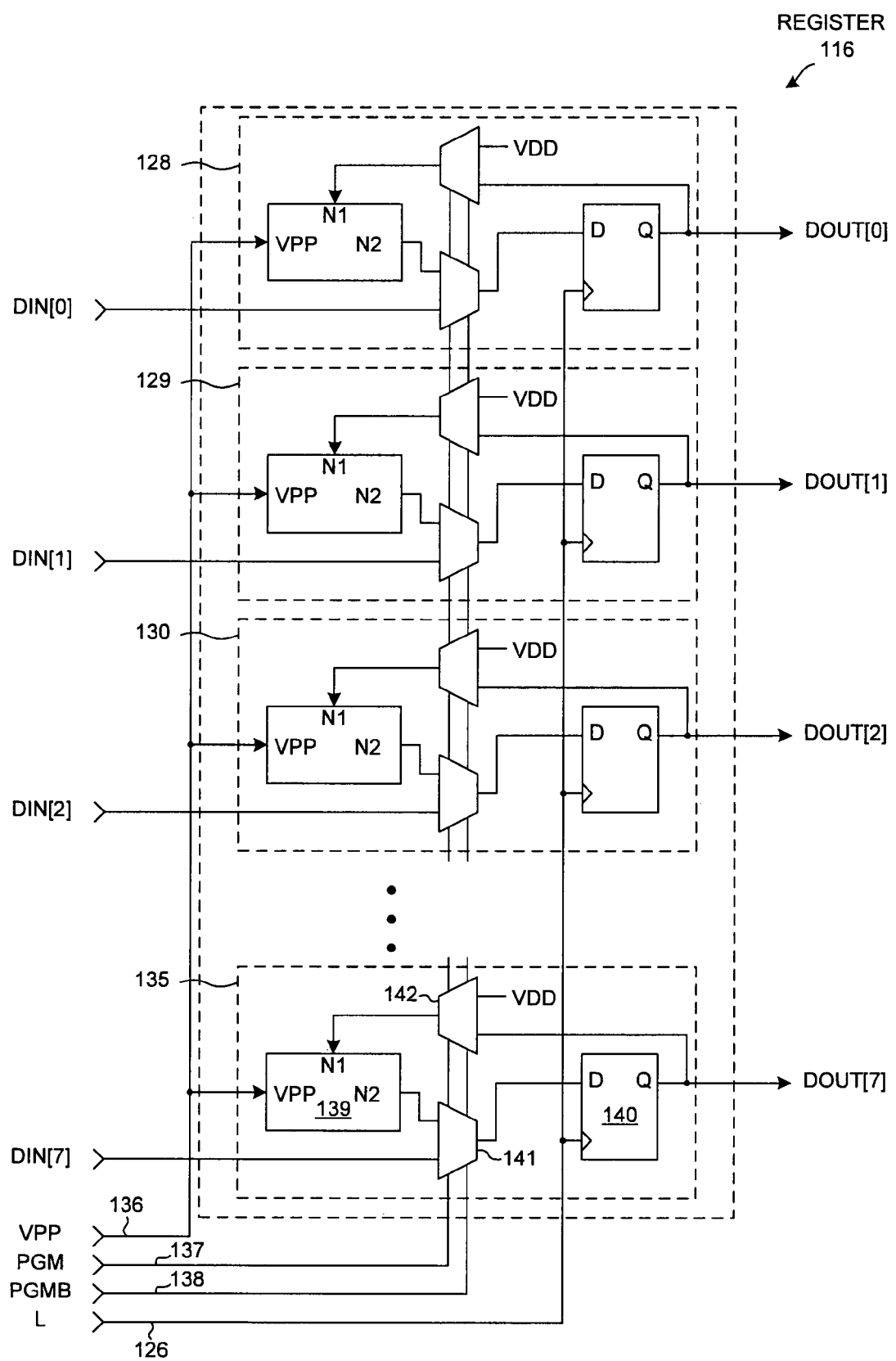
FIG. 3 is a diagram of one of the registers in the integrated circuit 101 of FIG. 2.

FIG. 3 is a more detailed diagram of register 116 of FIG. 2. Register 116 includes eight memory structures 128-135. Conductor 126 is the conductor 126 in FIG. 2 that conducts the gated local clock signal L from master tile 113 to register 116 in tile 105. Conductor 136 is the programming voltage conductor that conducts the programming pulse signal VPP from master tile 113 to the various other tiles 105-112. Conductors 137 and 138 are conductors that conduct the program signal PGM and its complement PGMB from master tile 113 to the various other tiles 105-112. Each of the memory structures of register 116 receives a corresponding one of the data input signals from data bus DIN[7:0]. The data output values DOUT[7:0] configure and control circuitry in tile 105.

Figure 4:
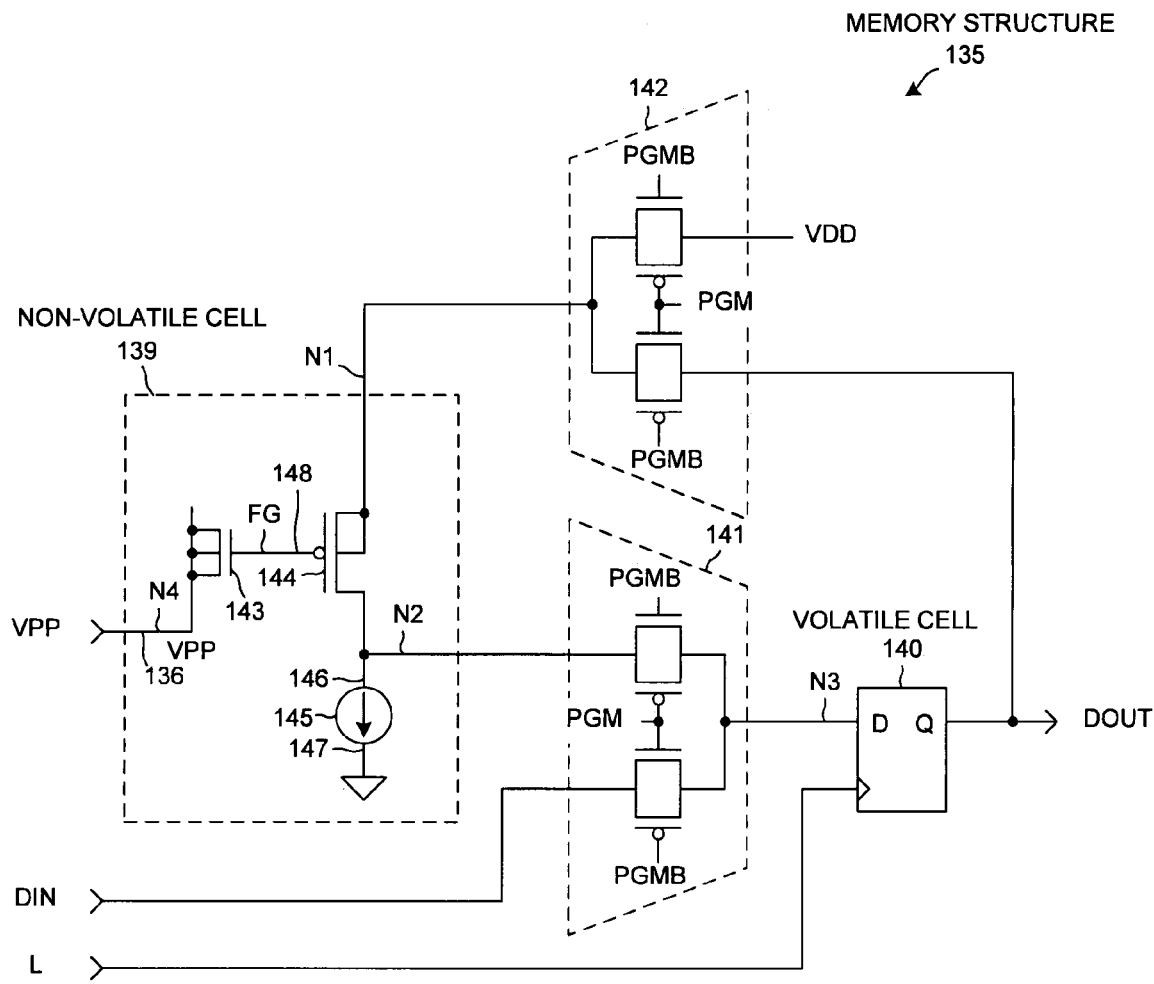
FIG. 4 is a diagram of one of the memory structures in register 116 of FIG. 3.

FIG. 4 is a more detailed circuit diagram of memory structure 135 of FIG. 3. Memory structure 135 includes a non-volatile cell 139, a volatile cell 140, a first multiplexer 141, and a second multiplexer 142. In this example, volatile cell 140 is a complementary logic D-type flip-flop although a transparent latch or other sequential logic element could also be used. Multiplexers 141 and 142 are composed of transmission gates, although multiplexers 141 and 142 could be digital logic multiplexers composed of gates. The select input lead identified with label PGM of first multiplexer 141 is connected to the select input lead identified with label PGM of second multiplexer 142. Similarly, the select input lead identified with label PGMB of first multiplexer 141 is connected to the select input lead identified with label PGMB of second multiplexer 142.

Non-volatile cell 139 includes an N-channel field effect transistor (NFET) 143, a P-channel field effect transistor (PFET) 144, and a pull-down element 145. In the example of FIG. 4, pull-down element 145 is a current source. One lead 146 of the pull-down element 145 is connected to the drain of PFET 144. The other lead 147 of pull-down element 145 is coupled to receive a ground potential. The source, drain, and body of NFET 143 are connected together and are also connected to programming voltage conductor 136. The gate of NFET 143 is connected to the gate of PFET 144 so as to form a floating gate node 148. Floating gate node 148 has a capacitance of approximately 0.01-0.10 picofarads. Node N1 is an input node of non-volatile cell 139. Node N2 is an output node of non-volatile cell 139. Node N4 is a programming pulse input node of non-volatile cell 139. PFET 144, NFET 143, and all the other transistors of FIG. 4, including field effect transistors that make up volatile cell 140 have identical gate insulator thicknesses. Cells 139 and 140 include no double-gate transistor structures. The gate area of PFET 144 is substantially larger than the gate area of NFET 143 in order to impress most of the N4-N1 voltage across NFET 143 due to capacitive voltage dividing.

Although non-volatile cell 139 is illustrated in this example as involving an NFET tunneling device and a PFET sensing device, non-volatile cell 139 can involve the tunneling device being an MOS capacitor, or another type of capacitor structure such as a polysilicon-insulator-polysilicon (PIP) capacitor, a metal-insulator-metal (MIM) capacitor structure, or a polysilicon-insulator-metal (PIM) capacitor structure. The sense device can perform both the tunneling function as well as the sense device function in some embodiments. For example, the sizes of transistors 143 and 144 in FIG. 4 could be made such that PFET 144 performs the tunneling function. In one embodiment, a pullup current source is connected to the source of a PFET, and the source of the PFET is the output node N2 of the non-volatile cell 139. The gate of the PFET is coupled to the gate of an NFET. The drain of the PFET is coupled to node N1. The source and drains of the NFET are coupled to VPP conductor 136. Other non-volatile cell structures can also be employed.

Figure 5:
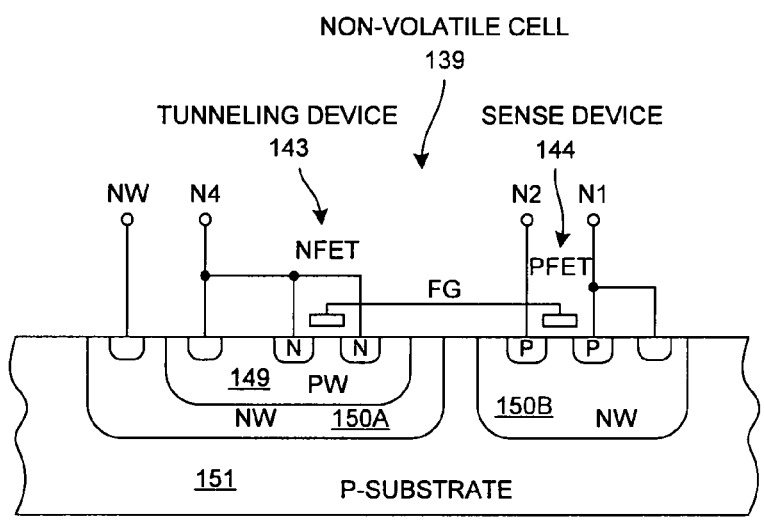
FIG. 5 is a simplified cross-sectional diagram of the non-volatile cell 139 in the memory structure 135 of FIG. 4.

FIG. 5 is a simplified cross-sectional diagram of the non-volatile cell 139 of FIG. 4. A twin-well complementary logic process (complementary logic is sometimes referred to as "CMOS" or "Complementary Metal Oxide Semiconductor" even though the gate may be a material other than metal) is employed. NFET 143 is disposed in a P-type well 149. P-type well 149 extends into an N-type well 150A. PFET 144 is disposed in N-type well 150B. N-type wells 150A and 150B extend into P-type substrate 151. PFET 144 has a large gate with respect to the size of the gate of NFET 143, so substantially all the voltage between nodes N1 and N4 drops across NFET 143. NFET 143 has a source-to-gate tunneling breakdown voltage (VTHB) of approximately 17.0 volts. Accordingly, if a positive voltage larger than approximately 17 volts is present on node N4 with respect to node N1, then electrons tunnel through the gate insulator of NFET 143 so that the charge (positive charge) on floating gate 148 increases. Similarly, if a negative voltage larger than approximately 17 volts is present on node N4 with respect to node N1, then electrons tunnel through the gate insulator of NFET 143 in the opposite direction. In this way, the voltage on the floating gate FG can be increased or decreased. Signal NW on an NW signal conductor (see FIG. 5) controls the voltage on N-well 150A. When the programming pulse signal VPP pulses high to +19 volts the NW signal has the potential of the VPP signal (+19 volts), whereas when the programming pulse signal VPP pulses low to −14.5 volts the NW signal is at ground potential (zero volts). Integrated circuit 101 includes a single circuit that drives the NW signal conductor, and the NW signal conductor is supplied to all tiles that have registers of memory structures.

Figure 6:
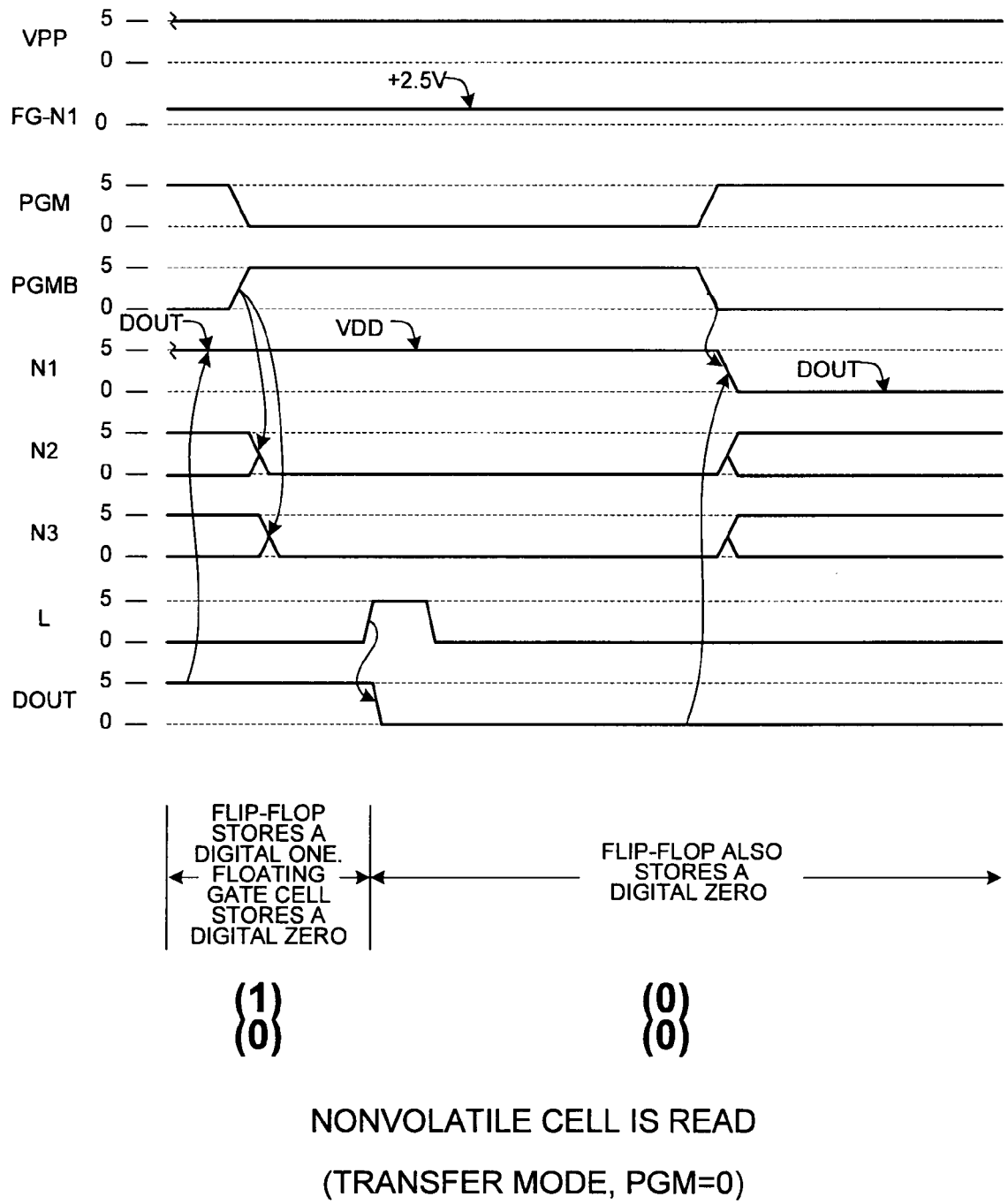
FIG. 6 is a waveform diagram that illustrates the transferring of digital logic low data from the non-volatile cell of the memory structure of FIG. 4 to the volatile cell of the memory structure of FIG. 4. The memory structure is in the transfer mode (PGM=0).

FIG. 6 is a simplified waveform diagram of a transfer mode operation of memory structure 135 of FIG. 4 when the content of non-volatile cell 139 is transferred into volatile cell 140. As explained above, such a transfer may be made to occur automatically after power up of integrated circuit 101. In the example of FIG. 6, non-volatile cell 139 initially stores a digital logic zero state and volatile cell 140 stores a digital logic one state. The term "zero state" or "digital logic low state" here correspond to a relatively low voltage as compared to the terms "one state" or "digital logic high state" that correspond here to a relatively higher voltage.

The storing of a digital logic zero state by non-volatile cell 139 is evidenced by a digital logic low voltage being present on output node N2 of non-volatile cell 139. Volatile cell 140 storing a digital logic one state is evidenced by signal DOUT having a digital logic high voltage. Next, as illustrated in FIG. 6, the program signal PGM is asserted to a digital logic low value. The low value of program signal PGM causes first multiplexer 141 to couple node N2 to the D input lead of the flip-flop of volatile cell 140. The program signal PGM being a digital logic low also causes second multiplexer 142 to couple the VDD supply voltage on the first data input lead of multiplexer 142 onto the data output lead of multiplexer 142. The voltage VDD is therefore present on node N1 as indicated by the waveform of FIG. 6. Local clock signal L is then made to transition from low to high. The low-to-high transition of local clock signal L causes flip-flop 140 to clock in the digital logic low value on node N3. DOUT is therefore seen to transition from high to low. The result is that the digital logic low value stored in non-volatile cell 139 is loaded into volatile cell 140.

Figure 7:
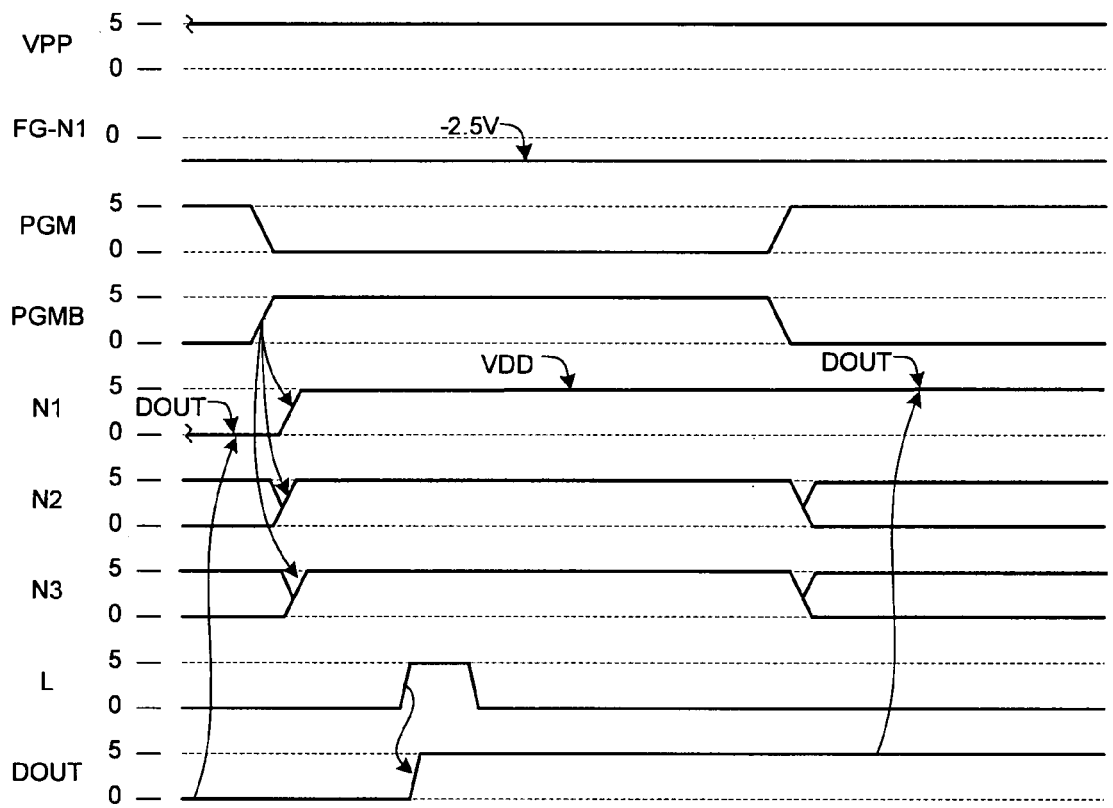
FIG. 7 is a waveform diagram that illustrates the transferring of digital logic high data from the non-volatile cell of the memory structure of FIG. 4 to the volatile cell of the memory structure of FIG. 4. The memory structure is in the transfer mode (PGM=0).

Had non-volatile cell 139 initially stored a digital logic high and had volatile cell 140 initially stored a digital logic low, then the DOUT value would have transitioned from low to high following the rising edge of local clock signal L. FIG. 7 is a simplified diagram that illustrates this transfer mode operation. Signal DOUT transitions from a digital logic low to a digital logic high upon the rising edge of local clock signal L. Transferring the content of non-volatile cell 139 into volatile cell 140 does not change the state stored by non-volatile cell 139.

FIGS. 6 and 7 illustrate the transferring of data from non-volatile cell 139 to volatile cell 140 in a transfer mode following power up of integrated circuit 101. Once this power up transfer occurs, the values of program signal PGM and its complement PGMB are fixed and remain constant so that: 1) first multiplexer 141 couples the data input node DIN to the D input lead of volatile cell 140, and 2) second multiplexer 142 couples the DOUT signal output from volatile cell 140 to the input node N1 of non-volatile cell 139. The waveforms of FIGS. 8-11 illustrate subsequent normal operation of integrated circuit 101 after the initial power up transfers (see FIGS. 6 and 7) have occurred. The values of program signals PGM and PGMB therefore are fixed in the waveforms of FIGS. 8-11.

Figure 8:
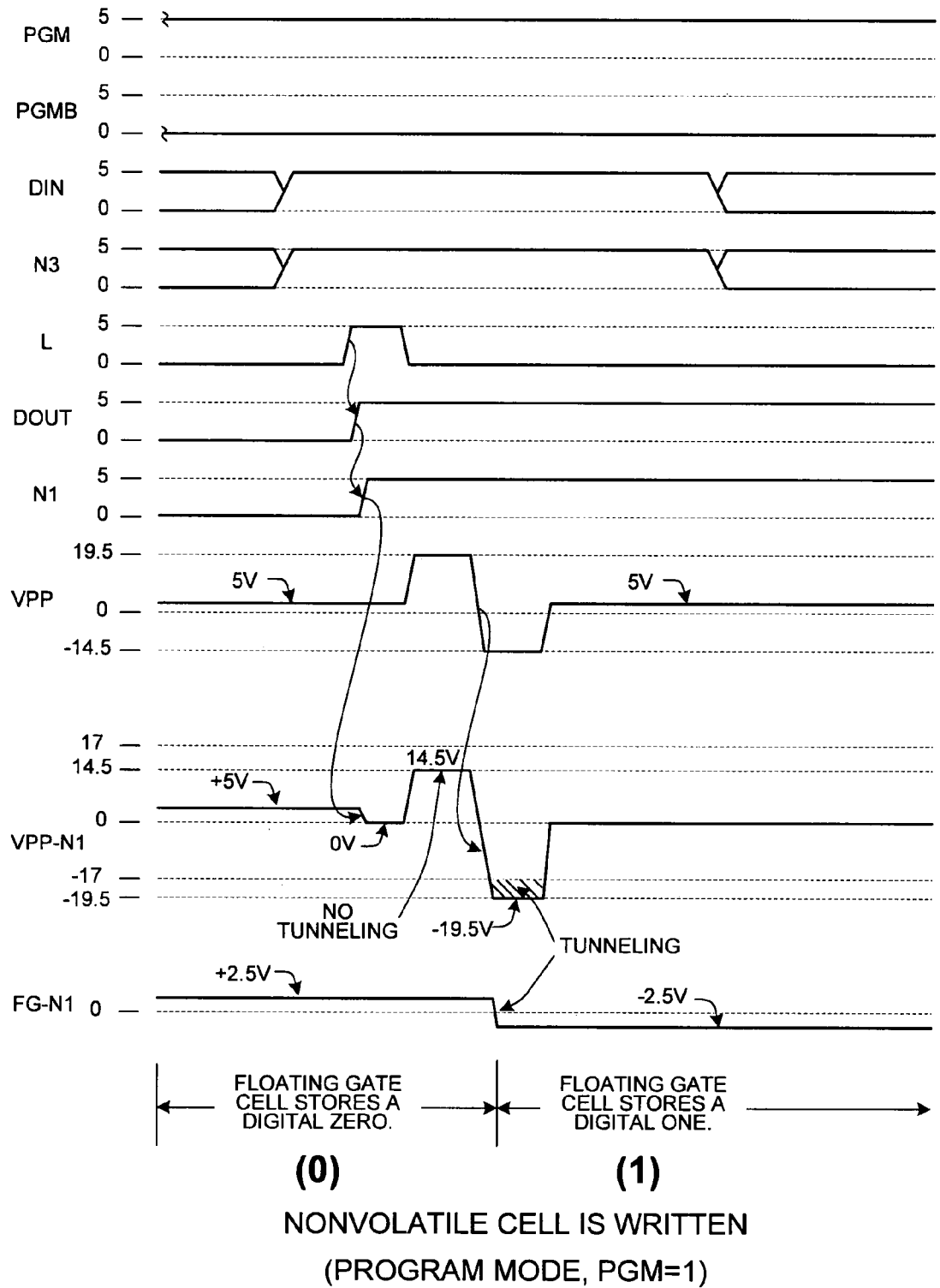
FIG. 8 is a waveform diagram that illustrates a programming of the memory structure of FIG. 4 such that the non-volatile cell no longer stores a digital logic zero state but rather stores a digital logic one state. The memory structure is in the program mode (PGM=1).

FIG. 8 is a simplified waveform diagram that illustrates the programming of non-volatile cell 139 with a digital logic high state. Initially, volatile cell 140 stores a digital logic low state as evidenced by the waveform DOUT being at a digital logic low value. Initially, non-volatile cell 139 stores a digital logic low state as evidenced by a positive voltage stored on FG versus N1. The data input value is a digital logic high as indicated by the waveform DIN. Local clock signal L then transitions from low to high, thereby clocking the digital logic high value of the DIN signal into flip-flop 140. DOUT is therefore seen to transition high. Because second multiplexer 142 is controlled by program signals PGM and PGMB to couple its lower data input lead to its data output lead, signal DOUT is coupled onto node N1. Programming pulse signal VPP is then made to pulse high to +19.5 volts and then to pulse low to −14.5 volts as illustrated by the VPP waveform in FIG. 8. Because a +5.0 volts is present on node N1, when VPP pulses high to +19.5 volts, only 14.5 volts is present between the source and gate of transistor 143. The waveform VPP-N1 illustrates this potential because most of the VPP-N1 voltage drop is impressed across NFET 143 and very little is impressed across the larger PFET 144. Because the tunneling threshold voltage of transistor 143 is approximately 17 volts, the positive going pulse of programming pulse signal VPP does not result in a change in the charge on the floating gate FG.

Next, VPP pulses low to −14.5 volts. The source to gate voltage across transistor 143 then exceeds the tunneling threshold voltage. The tunneling is illustrated in FIG. 8. As a consequence of this tunneling, positive charge is taken off the floating gate. The voltage between the floating gate voltage and the voltage on node N1 changes from +2.5 volts to −2.5 volts.

Figure 9:
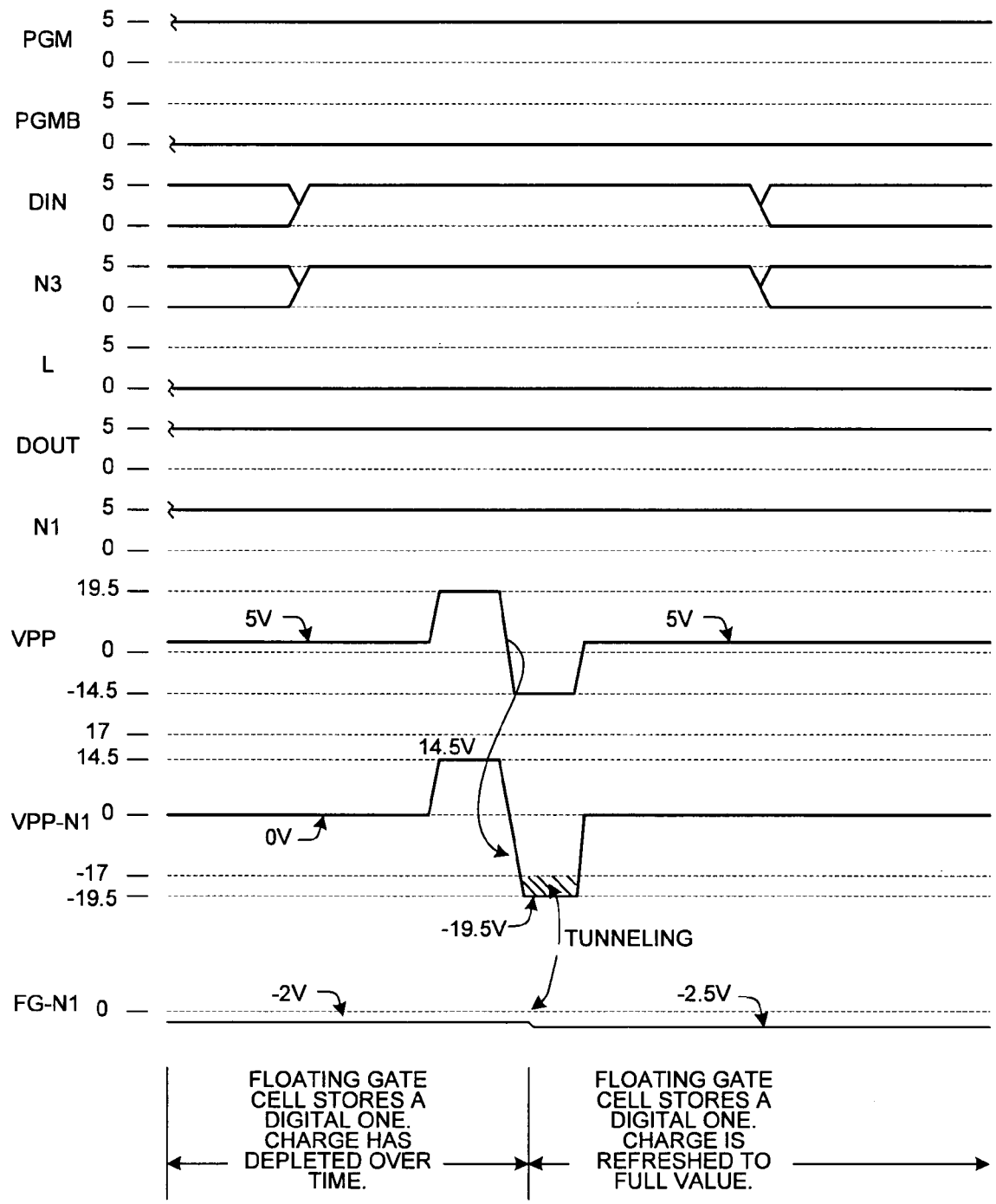
FIG. 9 is a waveform diagram that illustrates a refreshing of the charge stored on the floating gate FG in the memory structure of FIG. 4, where the charge stored corresponds to the non-volatile cell storing a digital logic one state. The memory structure is in the program mode (PGM=1).

FIG. 9 is a simplified waveform diagram that illustrates refreshing non-volatile cell 139 with a digital logic high state. Initially, volatile cell 140 stores a digital logic high state, but the voltage on floating gate FG is not as negative as it was immediately following programming. Immediately following programming, the FG-N1 waveform shows a voltage of −2.5 volts, but due to leakage of charge over time from the floating gate, the magnitude of the negative voltage in the FG-N1 waveform at the left of FIG. 9 has decreased to −2.0 volts.

The particular memory structure being considered in FIG. 9 is not being written to, so local clock signal L does not transition. The programming pulse signal VPP, however, is supplied to all the memory structures of integrated circuit 101. Because the voltage on node N1 is 5.0 volts, the high pulse of programming pulse signal VPP only results in +14.5 volts between the source and gate of transistor 143. This magnitude is not large enough to cause tunneling. The voltage FG-N1 is therefore not seen to change magnitude and it remains at −2.0 volts. When programming pulse signal VPP pulses low, however, the voltage difference between the +5.0 volts on node N1 and the −14.5 volts of VPP cause the voltage between the source and gate of transistor 143 to exceed its tunneling threshold voltage of 17.0 volts. Tunneling therefore occurs and the voltage on floating gate FG is refreshed. The magnitude of voltage FG-N1 is seen to increase from −2.0 volts to −2.5 volts. This −2.5 volt value is the fully refreshed value for non-volatile cell 139 storing a digital logic high state.

Figure 10:
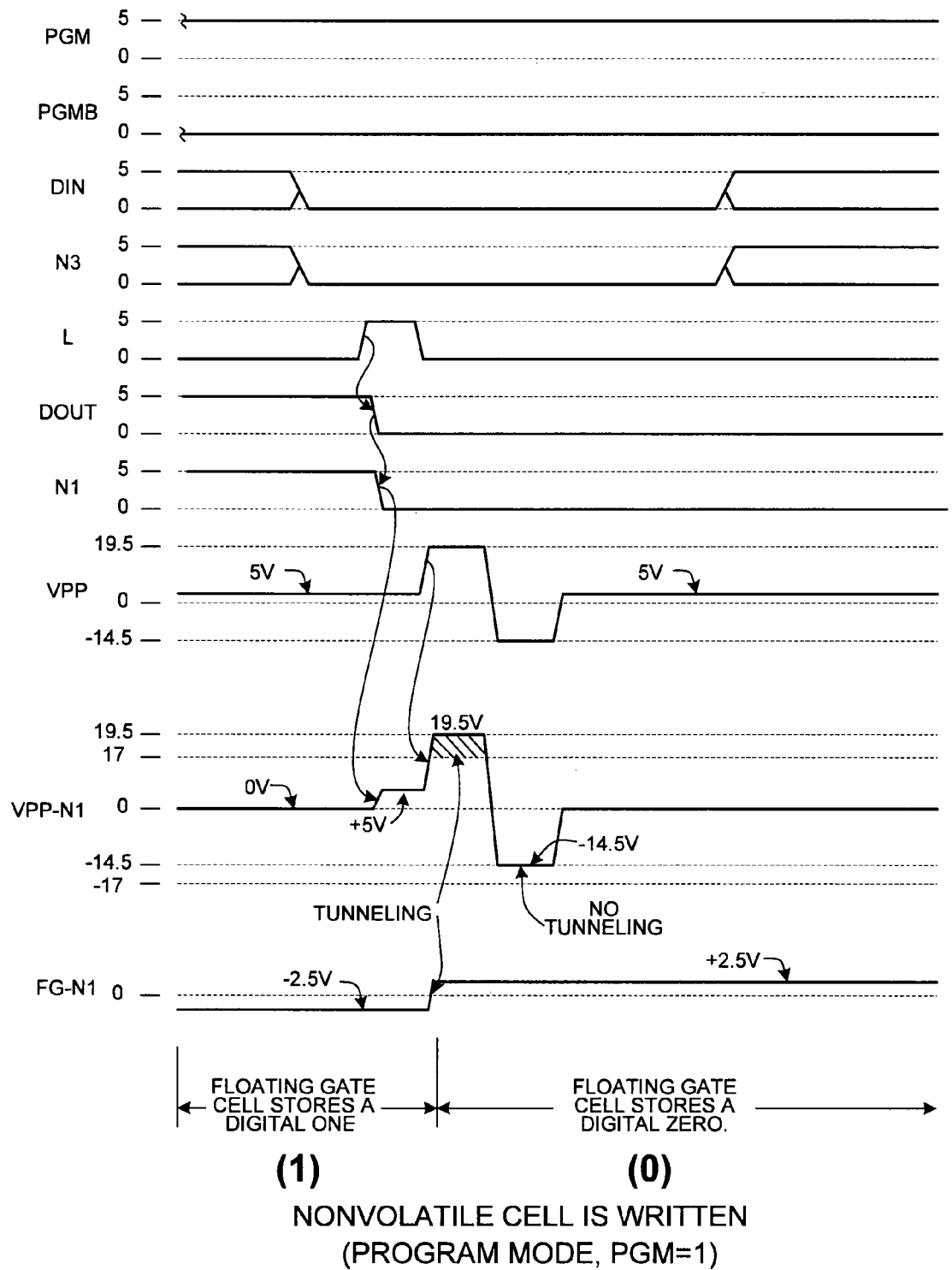
FIG. 10 is a waveform diagram that illustrates a programming of the memory structure of FIG. 4 such that the nonvolatile cell no longer stores a digital logic one state but rather stores a digital logic zero state. The memory structure is in the program mode (PGM=1).

FIG. 10 is a simplified waveform diagram that illustrates programming of non-volatile cell 139 with a digital logic low state. Initially, volatile cell 140 stores a digital logic high state as evidenced by the waveform DOUT being at a digital logic high value. Initially, non-volatile cell 139 stores a digital logic high state as evidenced by a negative voltage stored on FG with respect to N1. The data input value is a digital logic low as indicated by waveform DIN. Local clock signal L then transitions from low to high, thereby clocking the digital logic low value of the DIN signal into flip-flop 140. DOUT is therefore seen to transition from high to low. Because second multiplexer 142 is controlled by program signals PGM and PGMB to couple its lower data input lead to its data output lead, the signal DOUT is coupled onto node N1. The N1 waveform is seen to transition from high to low shortly after the DOUT waveform transitions from high to low.

Next, programming pulse signal VPP is made to pulse high to +19.5 volts and then pulse low to −14.5 volts as illustrated by the VPP waveform in FIG. 10. Because a zero volt potential is present on node N1, when VPP pulses high to +19.5 volts the source to gate voltage of transistor 143 exceeds the tunneling threshold voltage and and tunneling occurs. The waveform VPP-N1 illustrates this tunneling. Due to an increase in positive charge on floating gate FG, the voltage between the floating gate and node N1 (FG-N1) changes from approximately −2.5 volts to +2.5 volts. This represents a programming of the non-volatile cell with a digital logic zero.

After the positive pulse of programming pulse signal VPP, programming pulse signal VPP pulses low as illustrated by waveform VPP in FIG. 10. Because the voltage on node N1 is zero volts, only +14.5 volts is present between the source and gate of transistor 143. The voltage between the source and gate of transistor 143 is below the tunneling threshold voltage. No programming therefore occurs, and the FG-N1 waveform remains at +2.5 volts. FIG. 10 therefore represents the programming of non-volatile cell 139 that stored a digital logic high state with a digital logic low state.

Figure 11:
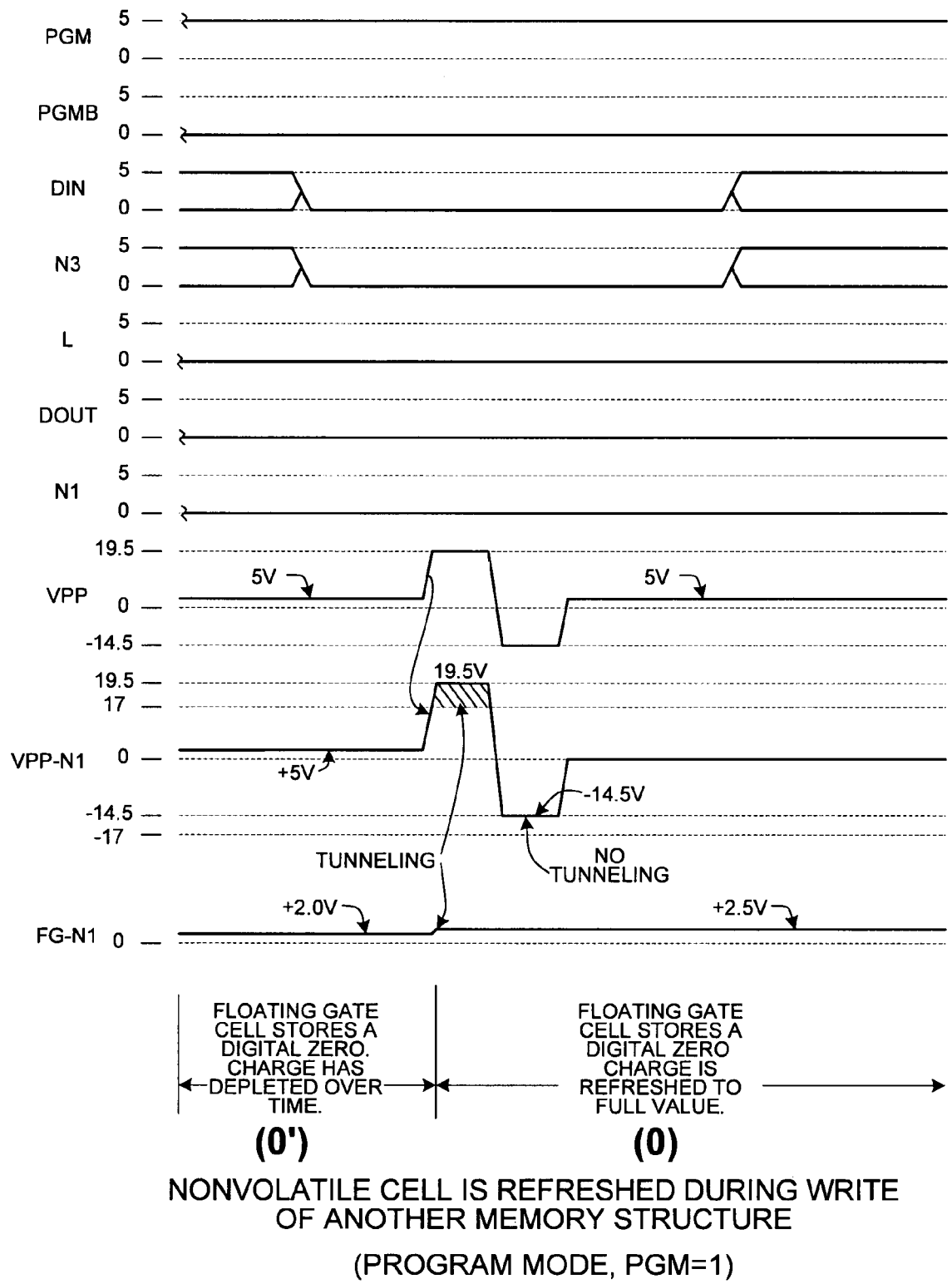
FIG. 11 is a waveform diagram that illustrates a refreshing of the charge stored on the floating gate FG in the memory structure of FIG. 4, where the charge stored corresponds to the non-volatile cell storing a digital logic zero state. The memory structure is in the program mode (PGM=1).

FIG. 11 is a simplified waveform diagram that illustrates refreshing of non-volatile cell 139 with a digital logic low state. Initially, volatile cell 140 stores a digital logic low state, but the voltage on floating gate FG is not as positive as it was immediately following programming. Immediately following programming, the FG-N1 waveform shows a voltage of +2.5 volts, but due to leakage of charge from floating gate FG, the magnitude of the positive voltage in the FG-N1 waveform at the left of FIG. 9 has decreased from +2.5 volts down to +2.0 volts. The particular memory structure being considered in FIG. 11 is not being written to, so local clock signal L does not transition. The programming pulse signal VPP, however, is supplied to all the memory structures of integrated circuit 101. Because the voltage on node N1 is zero volts, the high +19.5 volt pulse of the programming pulse signal VPP results in more than the 17 volt tunneling threshold being present between the source and gate of transistor 143. Tunneling therefore occurs such that the positive charge on the floating gate increases to its fully charged magnitude. Note that the magnitude of difference between the floating gate voltage FG and the voltage on node N1 is seen to increase from +2.0 volts to its fully charged value of +2.5 volts as indicated by the FG-N1 waveform. The digital logic low state stored in the non-volatile cell 139 has been refreshed. The programming pulse signal VPP then pulses low to −14.5 volts as indicated by the VPP waveform. Because the voltage on node N1 is zero volts, the negative VPP pulse only results in a −14.5 voltage between the source and gate of transistor 143. This −14.5 voltage is below the tunneling threshold voltage of 17 volts, so the charge on the floating gate of transistor 143 is not affected. The waveforms of FIG. 11 illustrate the refreshing of memory structures that store digital logic zero states. This refreshing occurs automatically when the programming-pulse signal pulses high and low, regardless of whether the register containing the memory structure is addressed or not.

Although the present invention is described in connection with certain specific embodiments for instructional purposes, the present invention is not limited thereto. For example, in one embodiment of integrated circuit 101 the decoder 115 is not provided in master tile 113, but rather each non-master tile includes a latch and an associated decoder. The decoder decodes addresses of registers contained in the tile of which the decoder is a part. The data bus is not just a bus for receiving input data, but rather is a time-multiplexed address/data bus. If a register in a tile is to be written, then in a first step the address of the particular tile and register is output by master tile 113 onto the address/data bus. A common address latch signal is simultaneously supplied to the latch in each of the tiles, so that the address (tile address and register address) is latched into latches in each of the tiles. In each tile, the address is output from the latch and is supplied to the associated local decoder within the tile. Each tile includes eight registers of memory structures. The upper five bits of the latched address identify one of the particular tiles, whereas the remaining three bits of the latched address identify one particular register of the eight registers in the identified tile.

Then, in a second step, master tile 113 puts the data to be written onto the address/data bus. As described above in connection with the waveforms of FIGS. 6-11, the program signals PGM and PGMB are fixed following power up so the selection of the multiplexers within the memory structures does not need to be changed. A common global clock signal is supplied to each of the tiles. This global common clock signal is, however, gated within the various tiles by an output of the decoder such that a gated local clock signal is supplied in each tile to the registers. The local clock signal only transitions if the tile address bits that are latched into the address latch in a tile properly address the tile. Accordingly, the data on the address/data bus is only clocked into one register in one tile. The programming pulse signal is then made to pulse such that if a volatile cell stores a digital logic state different from the digital logic state stored in the associated non-volatile cell then the non-volatile cell will be programmed to change state and to match the state stored in the volatile cell.

Rather than employing a ring of I/O cells, PMU integrated circuit 101 may employ Chip-Scale Packaging (CSP) or "flip-chip" technology and may have solder bumps or balls on its face side as well as top layer metal redistribution layers connected to these solder bumps or balls. The modular tile architecture and design technique set forth in this patent document shortens IC development times, and may allow a user of the architecture and technique to obtain design wins due to the user being able to design and provide a custom integrated circuit that meets specifications set by a prospective customer in a small amount of time as compared to more conventional IC design and layout techniques. Once the design win has occurred and initial integrated circuits are being supplied to the customer using the modular tile architecture, the layout and/or design of the integrated circuit can be re-laid-out, refined, optimized or moved to a smaller geometry process so that subsequent versions of the integrated circuit do not have the modular tile design but nonetheless are pin-for-pin compatible with the modular tile integrated circuit. The re-layout integrated circuit can therefore be used in place of the initial modular integrated circuit in high volume production of the customer's system, resulting in still further efficiencies and lower part cost. An additional novel aspect is therefore the re-layout, refinement, optimization and/or porting to a different process of an initial modular tile integrated circuit employing the novel memory structure set forth in this patent document.

Although a programming pulse signal is described above in connection with an embodiment in which a programming pulse signal is supplied from outside the integrated circuit 101 via an I/O terminal, in other embodiments the programming pulse signal is generated on-chip or is gated on-chip within the master tile. Although an example is set forth above that involves a microcontroller 102 of system 100 configuring the various tiles through master tile 113, a system involving integrated circuit 101 may involve no such microcontroller. Rather, integrated circuit 101 may be programmed with configuration information at the time of manufacture and testing of integrated circuit 101, and thereafter when integrated circuit 101 is embodied in a system the configuration information is not changed. Accordingly, various modifications, adaptations, and combinations of various features of the described embodiments can be practiced without departing from the scope of the invention as set forth in the claims.

What is claimed is:

1. An integrated circuit comprising:

a plurality of tiles, wherein each tile comprises a memory structure, wherein each memory structure comprises a non-volatile cell, a volatile cell, and a first multiplexer, wherein the non-volatile cell has a floating gate and can be programmed to store either a first state or a second state, wherein the volatile cell can be set to store either a first state or a second state, and wherein the first multiplexer has a first data input lead coupled to the volatile cell and a data output lead coupled to the non-volatile cell; and a programming voltage conductor that is coupled to the non-volatile cell of each memory structure in each of the plurality of tiles, wherein if a memory structure is set into a program mode and a programming pulse signal is supplied to the memory structure via the programming voltage conductor then the non-volatile cell will be programmed to store the state of the volatile cell if the state of the volatile cell and the state of the non-volatile cell differ, whereas if the state of volatile cell and the non-volatile cell do not differ then the non-volatile cell is not programmed to change state.

2. The integrated circuit of claim 1, wherein the volatile cell of each memory structure is a complementary logic sequential logic element taken from the group consisting of: a flip-flop, and a transparent latch.

3. The integrated circuit of claim 1, where each of said memory structures is of an identical construction, and comprises:
   the non-volatile cell having an input node, and output node, and a programming pulse input node, wherein the programming pulse input node is coupled to the programming voltage conductor;
   the volatile cell having a data input node, a clock input node, and a data output node;
   the first multiplexer having the first data input lead, a second data input lead, the data output lead, and a select input lead, wherein the second data input lead of the first multiplexer is coupled to the data output node of the volatile cell, and wherein the data output lead of the first multiplexer is coupled to the input node of the non-volatile cell;
   a second multiplexer having a first data input lead, a second data input lead, a data output lead, and a select input lead, wherein the first data input lead of the second multiplexer is coupled to the output node of the non-volatile cell, wherein the data output lead of the second multiplexer is coupled to the data input node of the volatile cell.

4. The integrated circuit of claim 1, wherein the programming pulse signal has a first pulse of a first voltage polarity and also has a second pulse of a second voltage polarity opposite the first voltage polarity.

5. The integrated circuit of claim 1, wherein each non-volatile cell comprises:
   an N-channel transistor having a source, a body, a drain, and a gate, wherein the source, body and drain are coupled together and to the programming voltage conductor;
   a P-channel transistor having a source, a body, a drain, and a gate, wherein the gate of the P-channel transistor and the gate of the N-channel transistor are coupled together; and
   a pull-down element having a first lead and a second lead, wherein the first lead is coupled to the drain of the P-channel transistor, wherein the second lead of the pull-down element is grounded.

6. The integrated circuit of claim 5, wherein the P-channel transistor has a larger gate area than the N-channel transistor.

7. The integrated circuit of claim 1, wherein the memory structure includes no double-gate transistor structures.

8. The integrated circuit of claim 1, wherein the memory structure includes no two transistors that have different gate insulator thicknesses.

9. The integrated circuit of claim 1, wherein the memory structure has a data input node, a program input node, and a clock signal input node, wherein if a signal on the program input node has a first digital logic value then the memory structure is in the program mode whereas if the signal on the program input node has a second digital logic value opposite the first digital logic value then the memory structure is in a transfer mode, wherein if the memory structure is in the program mode and a clock edge is received on the clock signal input node then a data value on the data input node is loaded into the volatile cell, wherein if the memory structure is in the transfer mode and a clock edge is received on the clock signal input node then the volatile cell is made to store the state stored in the non-volatile cell.

10. The integrated circuit of claim 1, further comprising:
   a decoder that gates a global clock signal such that the local clock signal is supplied onto a clock input lead of one of the memory structures.

11. The integrated circuit of claim 10, wherein the decoder is in the same tile as said memory structure.

12. The integrated circuit of claim 10, wherein the decoder is in a different tile from said memory structure.

13. The integrated circuit of claim 1, wherein each memory structure has a data input lead, the integrated circuit further comprising:
   a data conductor, the data conductor being coupled to the data input lead of each of the memory structures of the integrated circuit.

14. The integrated circuit of claim 1, further comprising:
   a voltage regulator, wherein the memory structure stores configuration information that configures the voltage regulator.

15. The integrated circuit of claim 1, wherein a single one of said memory structures can be set to store the first state without changing the states stored by the other of said memory structures of the integrated circuit, and wherein the single memory structure can be set to store the second state without changing the states stored by the other of said memory structures of the integrated circuit.

16. The integrated circuit of claim 1, wherein the volatile cell is a flip-flop and includes a plurality of transistors, and wherein the non-volatile cell includes a transistor, wherein the transistor has the floating gate, and wherein the transistor having the floating gate and the plurality of transistors of the flip-flop all have identical gate insulator thicknesses.

17. The integrated circuit of claim 1, wherein the non-volatile cell includes an N-channel field effect transistor (NFET) and a P-channel field effect transistor (PFET), wherein the NFET is disposed in a P-well, wherein the PFET is disposed in a first N-well, and wherein the P-well extends into a second N-well.

18. The integrated circuit of claim 1, wherein the non-volatile cell includes a tunneling device, wherein the tunneling device is taken from the group consisting of: a transistor, an MOS capacitor, a polysilicon-insulator-polysilicon (PIP) capacitor structure, a metal-insulator-metal (MIM) capacitor structure, and a polysilicon-insulator-metal (PIM) capacitor structure.

19. An integrated circuit comprising:
   a plurality of tiles, wherein each tile comprises a memory structure, wherein each memory structure comprises a non-volatile cell, sequential logic element, and a multiplexer, wherein the non-volatile cell has a floating gate and can be programmed to store either a first state or a second state, wherein the sequential logic element can be set to store either a first state or a second state, and wherein the multiplexer has a first data input lead coupled to the volatile cell and a data output lead coupled to the non-volatile cell; and
   a programming voltage conductor that is coupled to the non-volatile cell of each memory structure in each of the plurality of tiles, wherein if a programming pulse signal is supplied to the memory structure via the programming voltage conductor then the non-volatile cell will be programmed to store the state of the sequential logic element if the state of the sequential logic element and the state of the non-volatile cell differ at an onset of the programming pulse signal, whereas if the state of sequential logic element and the non-volatile cell do not differ at the onset of the programming pulse signal then the non-volatile cell is not programmed to change state.

20. The integrated circuit of claim 19, wherein the non-volatile cell includes a plurality of transistors, wherein the sequential logic element includes a plurality of transistors, and wherein all the transistors of the memory structure have identical gate insulator thicknesses.

21. The integrated circuit of claim 19, wherein the nonvolatile cell includes a sense transistor and a tunneling device, and wherein the tunneling device is taken from the group consisting of: a transistor, an MOS capacitor, a polysilicon-insulator-polysilicon (PIP) capacitor structure, a metal-insulator-metal (MIM) capacitor structure, and a polysilicon-insulator-metal (PIM) capacitor structure.

* * * * *